United States Patent
Mittal et al.

(10) Patent No.: US 12,259,806 B2
(45) Date of Patent: Mar. 25, 2025

(54) MANAGING HIGH PERFORMANCE SIMULATION REPRESENTATION OF AN EMULATION SYSTEM

(71) Applicant: Synopsys, Inc., Mountain View, CA (US)

(72) Inventors: Ribhu Mittal, Portland, OR (US); Deepak Kumar, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 218 days.

(21) Appl. No.: 17/958,994

(22) Filed: Oct. 3, 2022

(65) Prior Publication Data
US 2024/0111660 A1  Apr. 4, 2024

(51) Int. Cl.
*G06F 11/36* (2006.01)
*G06F 30/327* (2020.01)
*G06F 30/3308* (2020.01)

(52) U.S. Cl.
CPC ........ *G06F 11/3664* (2013.01); *G06F 30/327* (2020.01); *G06F 30/3308* (2020.01)

(58) Field of Classification Search
CPC .... G06F 30/33; G06F 30/327; G06F 30/3308; G06F 30/3315; G06F 11/3664
See application file for complete search history.

(56) References Cited

U.S. PATENT DOCUMENTS

| | | | | |
|---|---|---|---|---|
| 7,366,652 B2* | 4/2008 | Wang | ................ | G06F 30/331 716/136 |
| 7,424,418 B1* | 9/2008 | Soufi | ................ | G06F 30/33 703/13 |
| 7,447,621 B1* | 11/2008 | Lam | ................ | G06F 30/33 703/22 |
| 7,548,842 B2* | 6/2009 | Ganesan | ................ | G06F 30/33 370/258 |
| 9,195,786 B2* | 11/2015 | Stamness | ................ | G06F 30/33 |

(Continued)

FOREIGN PATENT DOCUMENTS

| CN | 1453699 A | * | 11/2003 | ......... G06F 17/5022 |
|---|---|---|---|---|
| CN | 103098058 A | * | 5/2013 | ......... G06F 17/5022 |

(Continued)

OTHER PUBLICATIONS

Hassoun et al., "A Transaction-Based Unified Architecture for Simulation and Emulation", Feb. 2005, IEEE, vol. 13, No. 2 (Year: 2005).*

Bening, "A Two-State Methodology for RTL Logic Simulation", 1999, ACM (Year: 1999).*

Bombieri et al., "FAST: An RTL Fault Simulation Framework based on RTL-to-TLM Abstraction", Jul. 2012, Springer (Year: 2012).*

(Continued)

*Primary Examiner* — Wei Y Zhen
*Assistant Examiner* — Junchun Wu
(74) *Attorney, Agent, or Firm* — LOWENSTEIN SANDLER LLP

(57) ABSTRACT

A processing device receives one or more inputs for design verification of an integrated circuit using an emulation compiler. The processing device determines a type of compiler for processing the one or more inputs. In response to determining that the type of compiler is a simulation compiler, the processing device modifies the simulation compiler according to the one or more inputs to form a modified simulation compiler to match one or more emulation semantics associated with the emulation compiler. The processing device performs a design verification using the modified simulation compiler.

11 Claims, 9 Drawing Sheets

(56) References Cited

U.S. PATENT DOCUMENTS

| | | | |
|---|---|---|---|
| 9,323,873 B2* | 4/2016 | Hodgson | G06F 30/367 |
| 2005/0114113 A1* | 5/2005 | Quayle | G06F 30/33 |
| | | | 703/23 |
| 2008/0244502 A1* | 10/2008 | Goto | G06F 30/33 |
| | | | 716/101 |
| 2008/0288910 A1* | 11/2008 | Chaudhry | G06F 30/367 |
| | | | 716/116 |
| 2010/0241414 A1* | 9/2010 | Yeh | G06F 30/33 |
| | | | 703/14 |
| 2013/0007549 A1* | 1/2013 | Chan | G06F 30/3308 |
| | | | 714/E11.167 |
| 2016/0314239 A1* | 10/2016 | Rabinovitch | G06F 30/33 |
| 2019/0286761 A1* | 9/2019 | Chou | G06F 30/39 |
| 2019/0384598 A1* | 12/2019 | Chou | G06F 30/367 |
| 2023/0103565 A1* | 4/2023 | Ghosh | G06F 30/12 |
| | | | 716/104 |

FOREIGN PATENT DOCUMENTS

| | | | | | |
|---|---|---|---|---|---|
| CN | 103282886 A | * | 9/2013 | | G06F 17/5045 |
| CN | 112580282 A | * | 3/2021 | | G06F 30/33 |
| CN | 114662426 A | * | 6/2022 | | G06F 21/577 |
| CN | 116681013 A | * | 9/2023 | | G06F 17/5022 |
| TW | I464679 B | * | 3/2009 | | |

OTHER PUBLICATIONS

Cong et al., "High-Level Synthesis for FPGAs: From Prototyping to Deployment", Apr. 2011, IEEE, vol. 30, No. 4 (Year: 2011).*
Laeufer et al., "RFUZZ: Coverage-Directed Fuzz Testing of RTL on FPGAs", 2018, ACM (Year: 2018).*
Kaja et al., "Towards Fault Simulation at Mixed Register-Transfer/Gate-Level Models", 2021, IEEE (Year: 2021).*

* cited by examiner

```
wire a, b, c, d, e, I, o1, o2, en;
assign a = 1'bz;
assign b = a;
assign c = bufif0(o1, i, en);
assign e = d;
assign e = b;
and(o2, b, d);
```

FIG. 2

```
reg explicitly_initialized_reg;
initial explicitly_initialized_reg = 1'b1;
reg un_initialized_reg;
reg undriven_reg;
always@(posedge clk)
      un_initialized_reg = data;
reg flop_initialized_reg;
always@(posedge clk or posedge rst) begin
     if(rst)
           flop_initialized_reg = 1'b1
     else
           flop_initialized_reg = data;
     end
```

FIG. 3A

```
reg un_initialized_reg;
reg undriven_reg;
reg  flop_initialized_reg;
always@(posedge clk or posedge rst) begin
   if(rst)
       flop_initialized_reg = 1'b1;
    else
       flop_initialized_reg = data;
    end
assign b1 = 1'bz;
assign b2 = 1'b1;
assign a1 = b1;
assign a1 = b2;
and(out, b1, b2);
```

FIG. 3B

MANAGING HIGH PERFORMANCE SIMULATION REPRESENTATION OF AN EMULATION SYSTEM

TECHNICAL FIELD

The present disclosure generally relates to an electronic design automation system, and in particular to managing high performance simulation representation of an emulation system for validating a circuit design.

BACKGROUND

Design verification is a part of a design planning flow of an integrated circuit. Design verification can be performed using simulation or hardware-based emulation. Hardware-based emulation may be used to verify large circuit design configurations and complex use cases that were often not possible with simulation-based design verification. Hardware-based emulation workflow starts with frequent and basic design bugs during early design bring up, register-transfer level (RTL) issues, and connectivity issues. During this phase of project execution, quick turnaround time becomes a key requirement.

SUMMARY

In one embodiment, a processing device receives one or more inputs for design verification of an integrated circuit using an emulation compiler. The processing device determines a type of compiler for processing the one or more inputs. In response to determining that the type of compiler is a simulation compiler, the processing device modifies the simulation compiler according to the one or more inputs to form a modified simulation compiler to match one or more emulation semantics associated with the emulation compiler. The processing device performs a design verification using the modified simulation compiler.

In one embodiment, the processing device modifies the simulation compiler according to the one or more inputs by identifying an RTL statement from the one or more inputs; parsing the RTL statement for one or more clock generation events and one or more non-clock generation events; processing the one or more clock generation events; and ignoring the one or more non-clock generation events.

In one embodiment, the processing device modifies the simulation compiler according to the one or more inputs by determining that a debug feature is enabled based on the one or more inputs; and in response to determining that the debug feature is not enabled based on the one or more inputs, disabling the debug feature in the simulation compiler.

In one embodiment, the processing device modifies the simulation compiler according to the one or more inputs by performing, using the one or more inputs, one or more transformations to convert a 4-state logic state to a 2-state logic state to match one or more emulation semantics associated with the emulation compiler.

In one embodiment, performing the one or more transformations to convert the 4-state logic state to the 2-state logic state includes parsing an RTL statement from the one or more inputs; in response to parsing the RTL statement, identifying an undriven register in the RTL statement. The processing device identifies an initial value from the one or more inputs, where the initial value is specified by a user. The processing device assigns the undriven register to the initial value.

In one embodiment, performing the one or more transformations to convert the 4-state logic state to the 2-state logic state includes determining that the integrated circuit is a multidriver circuit. The processing device parses an RTL statement from the one or more inputs. In response to parsing the RTL statement, the processing device identifies a value of a z logic state in the RTL statement. The processing device assigns the value of the z logic state to one or more values of wires of the integrated circuit.

In one embodiment, performing the one or more transformations to convert the 4-state logic state to the 2-state logic state includes parsing an RTL statement from the one or more inputs. In response to parsing the RTL statement, the processing device identifies an uninitialized register in the RTL statement. The processing device identifies an initial value from the one or more inputs, wherein the initial value is specified by a user. The processing device assigns the uninitialized register to the initial value.

In one embodiment, the processing device modifies the simulation compiler according to the one or more inputs by identifying a preloaded file input and performing a permanent programming operation to store one or more values of the preloaded file input into a multi-dimensional array-based software model associated with the simulation compiler.

In one embodiment, the processing device modifies the simulation compiler according to the one or more inputs by removing a fast clock source associated with an emulation compiler from the one or more inputs.

In one embodiment, the processing device modifies the simulation compiler according to the one or more inputs by performing blackbox removal.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 2 is a block diagram illustrating an example transformation implemented using the method described in FIGS. 4-5, in accordance with some embodiments of the present disclosure.

FIG. 3A is another block diagram illustrating an example transformation implemented using the method described in FIGS. 4-5, in accordance with some embodiments of the present disclosure.

FIG. 3B is another block diagram illustrating an example transformation implemented using the method described in FIGS. 4-5, in accordance with some embodiments of the present disclosure.

DETAILED DESCRIPTION

Figure 1:
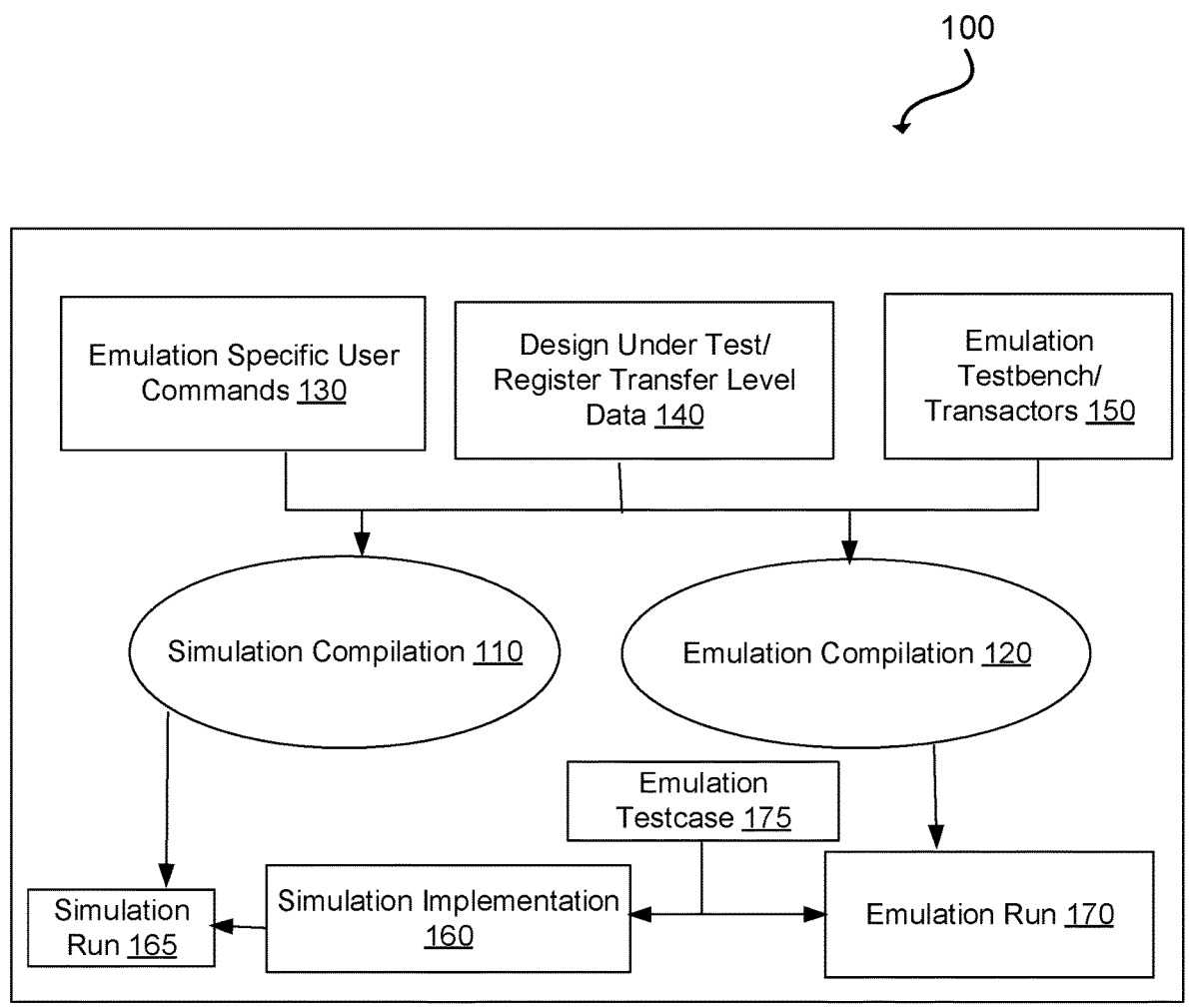
FIG. 1 is a block diagram illustrating the present system for managing high performance simulation representation of an emulation system, in accordance with some embodiments of the present disclosure.

Aspects of the present disclosure relate to managing high performance simulation representation of an emulation system. Design verification is a part of a design planning flow of an integrated circuit. Design verification may be performed using simulation or hardware-based emulation. Simulation is a software-based infrastructure that is flexible in terms of programmability, tracking, and monitoring of testbenches used in design verification. However, simulation often runs at a very slow speed. To handle the challenges that come with simulation performance, hardware-based emulation may be used to verify large circuit design configurations and complex use cases that were often not possible with simulation-based design verification. For example, users/customers may build hardware-based emulation models that are several billions of gates in size, which can be unviable for simulation to handle due to the slow speed at which simulation runs. As such, there is a need for a solution that offers a significant performance boost over simulation during early design bring-up of a project.

During early design bring-up phase of the project, turnaround time (e.g., total compile time plus run time) also becomes a challenge with hardware-based emulation verification because the focus remains on basic design bugs, register-transfer level (RTL) issues, and connectivity issues. In particular, total turnaround time may be impacted by long compile times present during hardware-based emulation. Further, the impact on total turnaround time may be significant due to multiple recompiles needed for small RTL fixes. As such, there is a need for a solution that has a faster total turnaround time.

Hardware-based emulation is also associated with increased costs as compared to simulation. For example, a user may take up to 1 quarter to enable a first functional model using hardware-based emulation. Since emulation may be costly, customers/users often limit the emulation window and/or emulation resources for financial reasons. As such, there is a need for a software-centric solution that can seamlessly transition to an emulation setup after a first functional model is enabled and running.

When using hardware-based emulation, users/customers may seek emulation-centric functional checks that can be used by their design teams in regression testing before new RTL changes are checked in. Design engineers are most familiar, however, with simulation. Further, as described above, due to the increased costs associated with emulation, emulation resources are generally too limited in quantity to support users/customers' requirements for emulation-centric functional checks. Since design teams often have to deliver quality RTL quickly, such functional checks may often need to be simulation-based and have a fast turnaround time for regression testing.

The present disclosure describes a system and method that is more cost-effective, can perform design verification with a faster turnaround time, and provides higher performance over simulation.

Aspects of the present disclosure address the above and other deficiencies by managing high performance simulation representation of an emulation system in a circuit design. Instead of using an emulation system to perform hardware verification, a processing device can use a simulation compiler to perform hardware verification, while modifying the simulation compiler according to the semantics of an emulation system.

In one embodiment, the processing device can receive one or more inputs for design verification that are to be used in an emulation compiler. The processing device can determine a type of compiler for processing the one or more inputs is a simulation compiler, rather than the emulation compiler, based on an indication specified in the one or more inputs (e.g., by a user providing the one or more inputs). The processing device can modify the simulation compiler according to the one or more inputs to be able to perform the design verification using emulation-specific semantics. The processing device can then perform the design verification using the simulation compiler.

Technical advantages of the approach described herein include improved performance and faster turnaround time in the circuit design system. By modifying a simulation compiler according to inputs that are emulation-specific, a compiler can be created that is simulation-based and thus has the fast turnaround time and flexibility advantages of a simulation system, while also having the high performance advantages of an emulation system. Both simulation and emulation based verification flows are essential to sign-off any modern system-on-chip (SoC) designs. In addition, by being able to use common inputs, there can be a commonality between the emulation and simulation environments, which can allow for seamless transitions between the environments based on user (e.g., customer) or system design specifications. Accordingly, there can be an overall improvement in performance and turnaround time while maintaining commonality between emulation and simulation environments.

FIG. 1 is a block diagram illustrating the present system for managing high performance simulation representation of an emulation system, in accordance with some embodiments of the present disclosure. As illustrated, a simulation representation 100 can include a number of components. Each of the components can be a discrete component that is ultimately packaged together into the simulation representation 100. Each of the components can have a number of internal sub-components (not shown in FIG. 1). In some embodiments, the simulation representation 100 can include a simulation compilation component 110, an emulation compilation component 120, a simulation implementation component 160, a simulation run component 165, an emulation run component 170, an emulation testcase 175, one or more emulation specific user commands 130, design under test (DUT) and/or register-transfer level (RTL) data 140, and emulation testbench and/or transactors 150.

Figure 8:
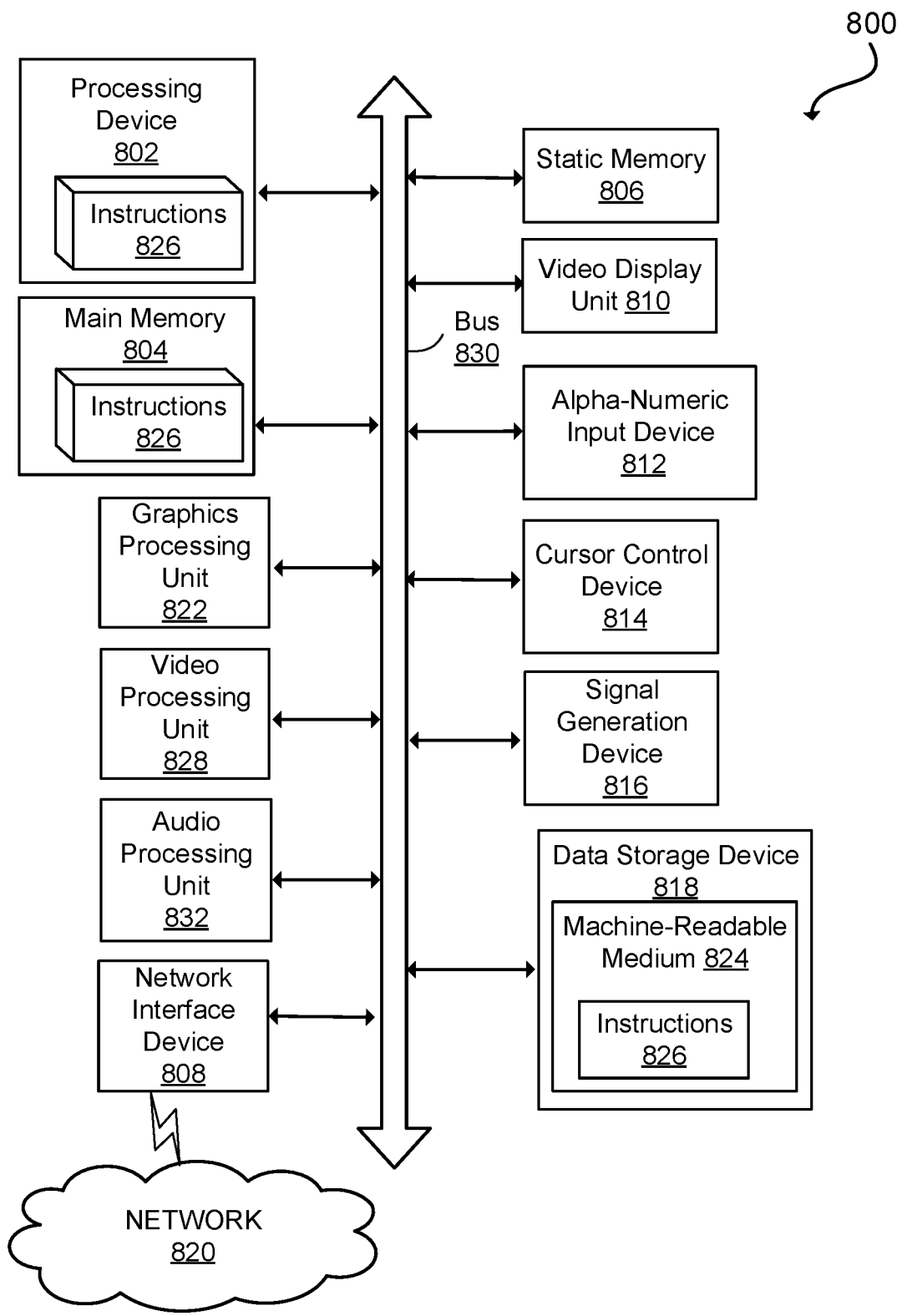
FIG. 8 depicts a diagram of an example computer system, in which embodiments of the present disclosure may operate.

In some embodiments, the simulation compilation component 120, simulation implementation component 160, and simulation run component 165 are software-based instructions, which can be implemented by one or more processing devices executing instructions (e.g., the processing device 802 of FIG. 8).

In some embodiments, the one or more emulation specific user commands 130, design under test (DUT) and/or register-transfer level (RTL) data 140, emulation testbench and/or transactors 150, and emulation testcase 175 can be used as one or more inputs to either the simulation compilation component 110 or the emulation compilation component 120. Each of the emulation specific user commands 130, DUT and RTL data 140, emulation testbench/transactors 150, and/or emulation testcase 175 can be stored in a database coupled to the present system.

In the case where simulation compilation is to be performed, the simulation implementation component 160 can receive the emulation testcase 175, where the emulation testcase 175 is a sequence of commands that is written, e.g., by a user, to create a particular test program that is run to ensure that a design is functional. The simulation implementation component 160 can perform modifications to the emulation testcase 175 to convert the emulation testcase 176 from emulation semantics to simulation semantics, such that the emulation testcase can be run at the simulation run component 165 using the simulation compilation component 110. In some embodiments, the simulation compilation component 110 is a set of software code that represents a compiler, e.g., the compiler 710 of FIG. 7. In addition to the emulation testcase 175, the simulation compilation component 110 can also receive one or more inputs from the following: the one or more emulation specific user commands 130, design under test (DUT) and/or register-transfer level (RTL) data 140, and emulation testbench and/or transactors 150.

In the case where emulation is to be performed, the emulation compilation component 160 can receive the emulation testcase 175. Since the emulation testcase 175 is already written to support emulation semantics, there may be no modifications to the emulation testcase 175. The emulation run component 170 can run the emulation testcase 175 using the emulation compilation component 120. In some embodiments, the emulation compilation component 120 is a set of software that represents a compiler, e.g., the compiler 710 of FIG. 7 In addition to the emulation testcase 175, the emulation compilation component 120 can also receive one or more inputs from the following: the one or more emulation specific user commands 130, design under test (DUT) and/or register-transfer level (RTL) data 140, and emulation testbench and/or transactors 150.

Further details regarding each of the components will be described with respect to FIGS. 4-5 herein.

Figure 4:
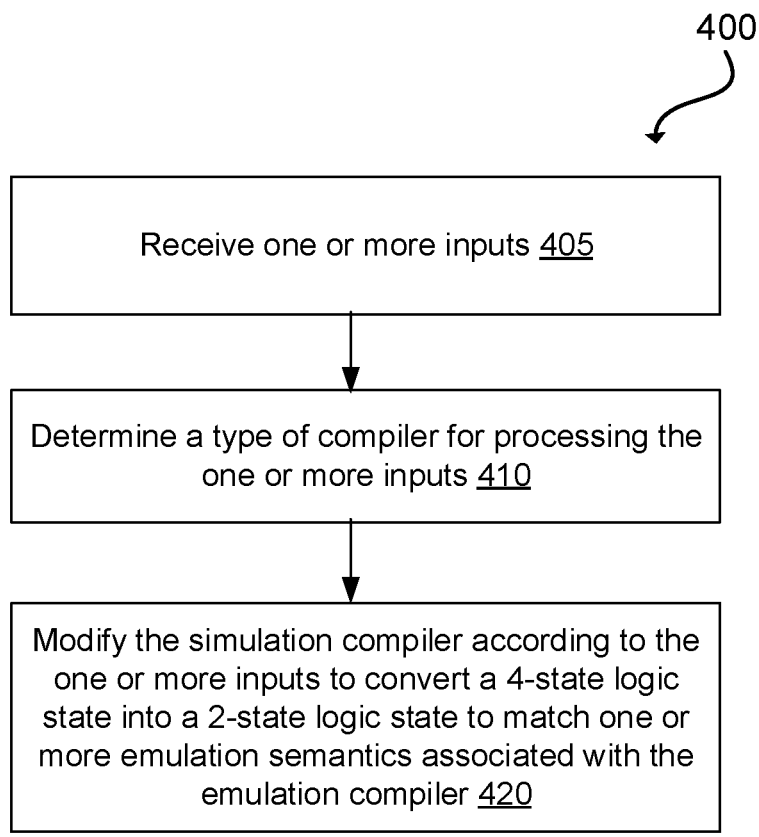
FIG. 4 is a flow diagram illustrating a method of managing high performance simulation representation of an emulation system for verifying a circuit design, in accordance with some embodiments of the present disclosure.
Figure 5:
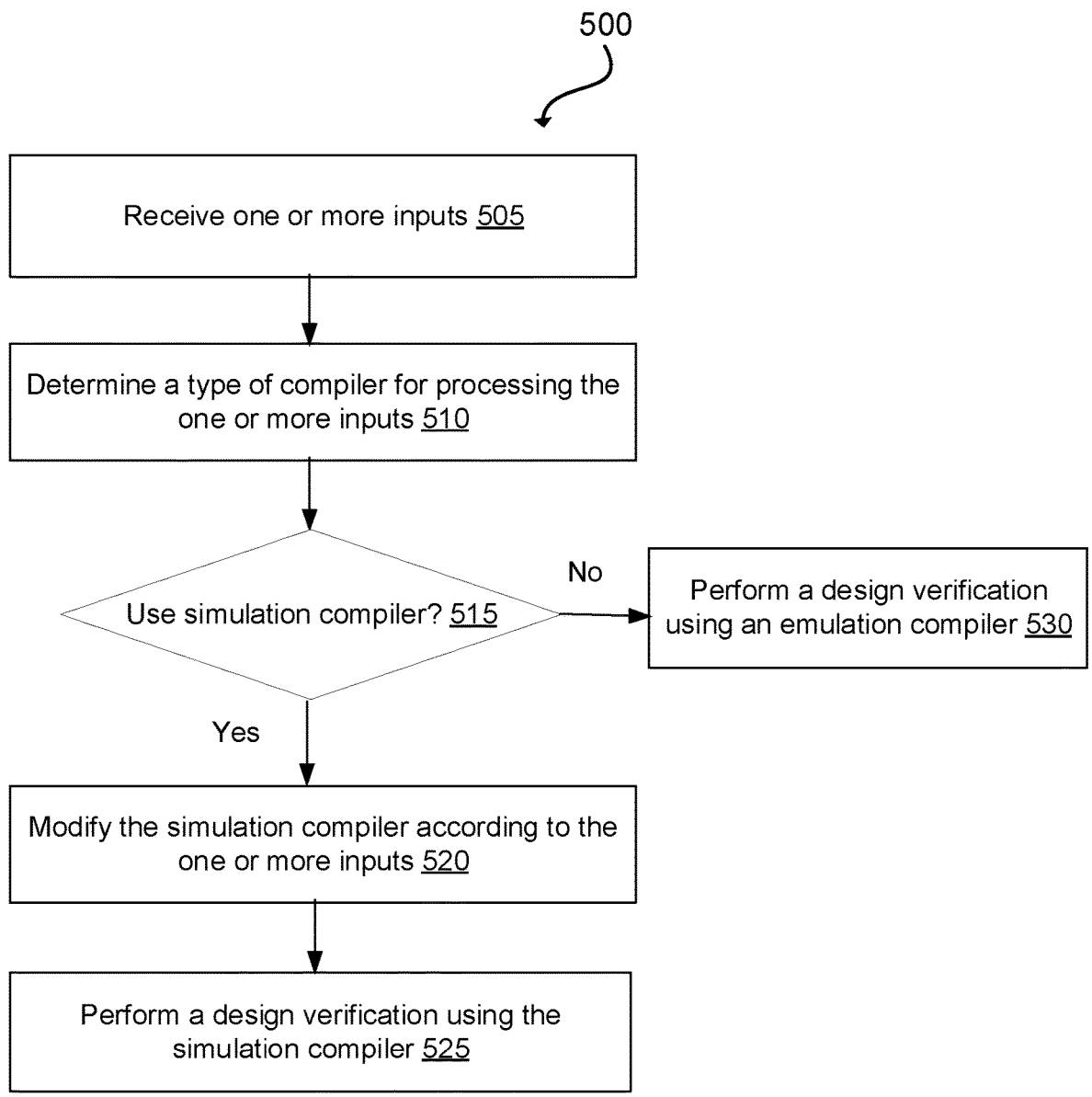
FIG. 5 is another flow diagram illustrating a method of managing high performance simulation representation of an emulation system for verifying a circuit design, in accordance with some embodiments of the present disclosure.

FIGS. 2, 3A, 3B are each block diagrams illustrating example transformations that are implemented using the methods described in FIGS. 4-5, in accordance with some embodiments of the present disclosure. Further details with respect to FIGS. 2, 3A, 3B will be described in conjunction with FIGS. 4-5.

FIG. 4 is a flow diagram illustrating a method of managing high performance simulation representation of an emulation system for verifying a circuit design, in accordance with some embodiments of the present disclosure. The method 400 may be performed by processing logic that includes hardware (e.g., circuitry, dedicated logic, programmable logic, microcode, etc.), software (e.g., instructions run on a processor to perform hardware simulation), or a combination thereof. In one embodiment, the method 400 is performed by the simulation compilation component 110 of FIG. 1.

Referring again to FIG. 4, at 405, the processing logic receives one or more inputs. In some embodiments, the one or more inputs are to be used for design verification of an integrated circuit. In some embodiments, the one or more inputs can include a testbench module and one or more transactors for performing the design verification in an emulation environment (e.g., the emulation testbench and/or transactors 150 of FIG. 1). The one or more transactors may include data used to implement the testbench module. In some embodiments, the testbench module may include one or more commands (e.g., from a user) for performing the design verification. In some embodiments, the one or more inputs include design under test (DUT)/register-transfer level (RTL) data (e.g., the DUT/RTL data 140 of FIG. 1) and/or user-specified commands (e.g., the emulation specific user commands 130 of FIG. 1). The processing logic may receive the one or more inputs from one or more users and/or user devices.

At 410, the processing logic determines a type of compiler for processing the one or more inputs received at 405. In some embodiments, the processing logic determines the type of compiler based on an indication specified by the one or more inputs. For example, the processing logic can identify a user-specified command from the one or more inputs, where the user-specified command is a command to perform the design verification using either a simulation compiler or an emulation compiler. In some embodiments, the processing logic can identify a user-specific command from the one or more inputs, where the user-specified command is an indication of a performance and/or turnaround time requirement. In some embodiments, the processing logic can determine the type of compiler by comparing the simulation compiler to the emulation compiler and determining the type of compiler that satisfies the user-specified requirement for performance and/or turnaround time. In response to determining that the type of compiler to be used for processing the one or more inputs is the simulation compiler, the processing logic proceeds as described with reference to 420. In some embodiments, in response to determining that the type of compiler to be used for processing the one or more inputs is the emulation compiler, the processing logic performs a design verification using the emulation compiler.

At 420, the processing logic modifies the simulation compiler according to the one or more inputs to convert a 4-state logic state into a 2-state logic state to match one or more emulation semantics of the emulation compiler. In some embodiments, the processing logic modifies the simulation compiler according to the one or more inputs in response to determining at 410 that the type of compiler to be used for processing the one or more inputs is the simulation compiler.

In some embodiments, modifying the simulation compiler according to the one or more inputs to convert the 4-state logic state into the 2-state logic state can include performing one or more transformations using the one or more inputs. Performing the one or more transformations can convert the 4-state logic state into the 2-state logic state in order to achieve behavioral equivalency. Behavioral equivalency may mean that the DUT should functionally pass in both simulation and emulation. A challenge of behavioral equivalency is resolving platform-level differences between simulation and emulation. Emulation, being a hardware-based platform, is a 2-state platform, where "0" and "1" are valid logic states inside a DUT mapped on an emulator. Simulation is a 4-state platform, where "0", "1", "x", and "z" logic states are supported. "z" state refers to a high-impedance state, and "x" state refers to a don't care state. The functional behavior between simulation and emulation may vary due to x/z propagation. Another challenge with 4-state simulation is that the 4-state platform also impacts simulation performance, where the run time may be slower and may consume more memory. The present disclosure supports a simulation compiler that is 4-state but can support emulation-like 2-state modeling for x and z in certain cases, in order to achieve behavioral equivalence with higher performance.

In a 4-state simulation, a net can receive a value of "z" from a driver driving a constant "z". In some embodiments, the net can receive a value of "z" from an output of a tristate construct producing "z". In some embodiments, the net can receive a value from "z" implicitly if the net is undriven. Referring to FIG. 2, the processing logic assigns a wire "a" with a "z" state value, e.g., using direct assignment. The processing logic further assigns a wire "b" with a "z" state value, e.g., using an indirect assignment (i.e., by assigning wire "b" to wire "a" which was directly assigned to "z" as illustrated in FIG. 2). If the value of "en" is determined to be 1, the processing logic assigns a wire "c" with a "z" state value. In order to correct functional behavior to achieve behavioral equivalence as described herein above, the processing logic can propagate the "z" value to downstream logic on a case-by-case basis. For example, as illustrated in FIG. 2, wire "e" is multi-driven by wire "b" and wire "d". For a correct multi-driver resolution, the processing logic propagates the "z" value through wire "a" and wire "b". In the aforementioned example, if "a" or "b" were converted to a 2-state value, multi-driver resolution can produce a wrong value for wire "e". In some embodiments, for cases other than multi-driver, the processing logic replaces (e.g., assigns, substitutes, etc.) the "z" value with a constant 2-state value. The last statement illustrated in FIG. 2 refers to an AND gate modeled using "b" and "d" as inputs and "o2" as the output. In this statement, the processing logic can replace (e.g., assign, substitute, etc.) the "1'bz" value of "b" with a 2-state constant value. The 2-state constant value can be determined based on a user choice of pull-up, pull-down, keeper, etc. In the aforementioned statement, performing the described transformation to replace the value of "b" with a 2-state constant value enables the simulation behavior to be functionally equivalent to emulation behavior. Without the transformation, the AND gate may produce an "X" value, which is different from emulation behavior.

In some embodiments, the processing logic can implement one or more transformations for a "reg" datatype to ensure consistent functional behavior between simulation and emulation, as described herein. A datatype defines a type of value that a signal can hold. A "reg" datatype refers to a register datatype. A "reg" datatype declaration in simulation determines the registers. In simulation, registers are initialized either to an "X" value or to a specific value in the RTL. In a hardware-based emulation flow, a "reg" datatype is an output of a library cell in either of two logic states, 0 or 1. In some embodiments, the processing logic can perform one or more transformations for the "reg" datatype. In some embodiments, the processing logic determines whether the "reg" datatype is initialized (e.g., assigned an initial value) or uninitialized (e.g., not assigned an initial value). The processing logic can determine whether the "reg" datatype is initialized or uninitialized based on the one or more inputs at 405. In response to determining that the "reg" is uninitialized, the processing logic can initialize the "reg". In some embodiments, the processing logic can determine an asynchronous set/reset based on the coding style of the "reg" datatype, which can be used to determine a correct initialization of the "reg" datatype. In some embodiments, the processing logic can determine is the "reg" datatype (e.g., as used in combinatorial logic) is undriven. If the "reg" datatype is undriven, the processing logic can initialize the "reg" to an "X" value, whereas in emulation, undriven "reg" datatypes are initialized with a "z" value. In some embodiments, the processing logic can determine the drive value by a user-specified option for an undriven net (e.g., from the one or more inputs at 405), such as a 0 or 1 depending on the user's preferences.

For example, referring to FIG. 3A, in some embodiments, the processing logic can determine that a "reg" is initialized (e.g., "explicitly_initialized_reg" as illustrated in FIG. 3A). If the processing logic determines that the "reg" is initialized, the processing logic does not transform the reg, e.g., the processing logic ignores the "reg" datatype. In response to determining that the "reg" datatype is uninitialized (e.g., "un_initialized_reg" as illustrated in FIG. 3A), the processing logic can assign an initial value (e.g., 0) to the "reg" datatype. In some embodiments, the processing logic can initialize an "undriven_reg" datatype (e.g., a register that is not driven anywhere in the RTL) to an initial value, such as "1'bz". In some embodiments, the processing logic can identify a "flop_initialized_reg" (e.g., a register where a flop behavior is defined through an always block). The processing logic determines whether a reset "rst" is active. If the reset "rst" is active, the processing logic assigns "flop_initialized_reg" to an initial value (e.g., 1'b1). If the reset "rst" is not active, the processing logic flops the data on the positive edge of the clock. In some embodiments, other types of transformations can be performed in order to convert the 4-state infrastructure of an emulation system to a 2-state infrastructure of a simulation system.

Referring to FIG. 3B, the processing logic can parse an RL statement from the one or more inputs. The processing logic can identify an undriven reg (e.g., "undriven_reg_ as illustrated in FIG. 3B). In response to identifying the undriven reg, the processing logic can initialize the undriven reg to either 0 or 1 logic states. In some embodiments, the processing logic can initialize the undriven reg by identifying a user-specified value (e.g., from the one or more inputs at 405).

In some embodiments, the processing logic can handle the "z" state for functional equivalence by parsing the RTL statement from the one or more inputs and identifying a value of a z logic state. The processing logic can replace (e.g., substitute) the value of the z logic state (to which "b1" is assigned) with a 2-state value (e.g., pull-up, pull-down, etc.) and evaluating the AND gate illustrated in FIG. 3B.

In some embodiments, the processing logic can handle the "z" state for multidriver cases. For example, in FIG. 3B, the processing logic can determine that "a" is multidriven. The processing logic can parse the RTL statement from the one or more inputs and identify a value of a z logic state. The processing logic can assign the value of the z logic state to one or more values or wires. For example, the processing logic can assign a1 to equal b1 in order to handle the "z" state.

In some embodiments, the processing logic can handle the "x" state in cases where "reg" is uninitialized. The processing logic can parse the RTL statement from the one or more inputs and identify an uninitialized register. The processing logic can initialize the uninitialized reg by identifying a user-specified value (e.g., from the one or more inputs at 405). For example, in FIG. 3B, the processing logic can initialize "un_initialized_reg" to 0 or a user-specific value (e.g., from the one or more inputs at 405).

FIG. 5 is another flow diagram illustrating a method of managing high performance simulation representation of an emulation system for verifying a circuit design, in accordance with some embodiments of the present disclosure. The method 500 may be performed by processing logic that includes hardware (e.g., circuitry, dedicated logic, programmable logic, microcode, etc.), software (e.g., instructions run on a processor to perform hardware simulation), or a combination thereof. In one embodiment, the method 500 is performed by the simulation compilation component 110 of FIG. 1.

Referring again to FIG. 5, at 505, the processing logic receives one or more inputs. In some embodiments, the one or more inputs are to be used for design verification of an integrated circuit. In some embodiments, the one or more inputs can include a testbench module and one or more transactors for performing the design verification in an emulation environment (e.g., the emulation testbench and/or transactors 150 of FIG. 1). The one or more transactors may include data used to implement the testbench module. In some embodiments, the testbench module may include one or more commands (e.g., from a user) for performing the design verification. In some embodiments, the one or more inputs include design under test (DUT)/register-transfer level (RTL) data (e.g., the DUT/RTL data 140 of FIG. 1) and/or user-specified commands (e.g., the emulation specific user commands 130 of FIG. 1). The processing logic may receive the one or more inputs from one or more users and/or user devices.

At 510, the processing logic determines a type of compiler for processing the one or more inputs received at 505. In some embodiments, the processing logic determines the type of compiler based on an indication specified by the one or more inputs. For example, the processing logic can identify a user-specified command from the one or more inputs, where the user-specified command is a command to perform the design verification using either a simulation compiler or an emulation compiler. In some embodiments, the processing logic can identify a user-specific command from the one or more inputs, where the user-specified command is an indication of a performance and/or turnaround time requirement. In some embodiments, the processing logic can determine the type of compiler by comparing the simulation compiler to the emulation compiler and determining the type of compiler that satisfies the user-specified requirement for performance and/or turnaround time.

At 515, in response to determining that the type of compiler to be used for processing the one or more inputs is the simulation compiler, the processing logic proceeds as described with reference to 520. In some embodiments, in response to determining that the type of compiler to be used for processing the one or more inputs is the emulation compiler, the processing logic performs a design verification using the emulation compiler at 530. At 520, the processing logic modifies the simulation compiler according to the one or more inputs to form a modified simulation compiler. In some embodiments, the processing logic modifies the simulation compiler according to the one or more inputs in response to determining at 510 that the type of compiler to be used for processing the one or more inputs is the simulation compiler.

In some embodiments, modifying the simulation compiler according to the one or more inputs can include identifying a register-transfer level (RTL) statement from the one or more inputs. The processing logic can parse the RTL statement for one or more events, such as one or more clock generation events and/or one or more non-clock generation events. The processing logic can identify a clock generation event by identifying a statement where a signal is the same on either side of the statement. The processing logic can identify a non-clock generation event by identifying a statement where a signal is not the same on either side of the statement. In some embodiments, the processing logic can parse an RTL statement for one or more non-synthesizable constructs, such as "#delay". For example, the RTL statement could be the following: "assign clock=#5~clock;", which describes generating a clock with a 5 units of time (e.g., nanoseconds) delay (indicated by the #5). In the aforementioned example, the processing logic can identify the RTL statement as a clock generation event because the signal on either side of the assign statement is the same (i.e., the clock signal). Another example for a non-clock generation event could be the following: "assign sig_a=#5 sig_b;", which describes assigning the value of sig_b to sig_a after a 5 units of time delay. In the aforementioned example, the processing logic can identify the RTL statement as a non-clock generation event because the signal on either side of the assign statement is different (i.e., sig_a and sig_b are different signals). In some embodiments, the processing logic can process the one or more clock generation events. In some embodiments, the processing logic can ignore the one or more non-clock generation events. For example, in the aforementioned examples, the processing logic can process the delay associated with clock generation event and ignore the time delay associated with a non-clock generation event. In some embodiments, ignoring #delay could result in incorrect behavior. For example, a RTL statement could be the following: "always #10 clock=~clock;". By ignoring the delay of 10 time units, this would behave like an infinite 0-delay loop in simulation. The processing logic identifies such RTL coding with missing or incomplete sensitivity lists and converts the always block into a combinational logic. By eliminating #delays where possible, it reduces the number of events in simulation flow which, in turn, improves the performance of an event driven simulation system, such as the simulation compilation component 110 of FIG. 1.

In some embodiments, modifying the simulation compiler according to the one or more inputs can include removing the compiler's dependency on a fast clock, which is implemented in hardware-based emulation. For example, in hardware-based emulation, clock generation occurs from an internal fast clock source. This fast clock may be used to model the majority of emulation testbench runtime infrastructure and the hardware/software interface between an emulator and the emulation testbench running on a host system. When used in a simulation compiler, however, the fast clock can impede performance. Modifying the simulation compiler can therefore include removing the compiler's dependency on an internal clock source (e.g., a fast clock). In some embodiments, the processing logic can identify the emulation-centric custom implementation associated with the fast clock from the one or more inputs (e.g., from the emulation testbench/transactors) and filter out (e.g., remove and/or ignore) the identified emulation-centric custom implementation using standard Direct Programming Interface (DPI) semantics of the Language Reference Manual, eliminating a performance bottleneck due to a dependency on a fast clock. For example, the processing logic can identify one or more RTL blocks that use a fast clock source from the one or more inputd (e.g., the emulation testbench and/or transactors). The processing logic can filter out (e.g., remove and/or ignore) the RTL blocks that use the fast clock source.

In some embodiments, modifying the simulation compiler according to the one or more inputs can include determining that a debug feature is enabled based on the one or more inputs. In some embodiments, determining that the debug feature is enabled based on the one or more inputs can include identifying an input of the one or more inputs specifying that the debug feature is enabled and/or disabled. In response to determining that the debug feature is not enabled, the processing logic can disable the debug feature in the simulation compiler. By compacting the model, this produces high performance simulation representation of emulation system.

In a hardware-based emulation flow, the design of an integrated circuit is synthesized, placed, and timed inside, e.g., an FGPA chip. Similar to an ASIC flow, one or more optimizations may be performed in the design at different stages of an emulation compiler flow, where a final objective of the emulation compiler is to produce a highly compact hardware representation of the design so that it can be placed within a minimum number of, e.g., FGPA chips. In contrast, a simulation flow may build a software computational model of the entire design. In some embodiments, the simulation compiler is modified to produce an optimal DUT model for the highest performance. These modifications may include blackbox removal, undriven initialization, constant propagation, etc. For example, in some embodiments, the processing logic can drive any undriven net in the design by a constant value. In some embodiments, the processing logic can drive an output of an empty (e.g., blackbox) module to a constant value. In some embodiments, the processing logic can propagate the one or more constant values downstream, thus maximizing design optimization and producing a highly compact view of design in simulation which boosts performance.

In some embodiments, modifying the simulation compiler according to the one or more inputs can include identifying a preloaded memory file. The processing logic can permanently program one or more values of the preloaded memory file into a multi-dimensional array-based software model for the memory inside the DUT. The processing logic can perform constant propagation using the one or more values stored in the multi-dimensional array-based software model. In some embodiments, this action may remove a user's ability to perform read and/or write operations on DUT memory during test execution. In some embodiments, the processing logic may identify write-only memory defined in the RTL from the one or more inputs and may filter out (e.g., remove and/or ignore) the identified write-only memory in the DUT. Such memory optimizations may produce a high performance simulation representation of an emulation model.

In some embodiments, modifying the simulation compiler according to the one or more inputs can include performing one or more transformations using the one or more inputs. Performing the one or more transformations can convert a 4-state infrastructure platform into a 2-state infrastructure platform in order to achieve behavioral equivalency. Behavioral equivalency may mean that the DUT should functionally pass in both simulation and emulation. A challenge of behavioral equivalency is resolving platform-level differences between simulation and emulation. Emulation, being a hardware-based platform, is a 2-state platform, where "0" and "1" are valid logic states inside a DUT mapped on an emulator. Simulation is a 4-state platform, where "0", "1", "x", and "z" logic states are supported. "z" state refers to a high-impedance state, and "x" state refers to a don't care state. The functional behavior between simulation and emulation may vary due to x/z propagation. Another challenge with 4-state simulation is that the 4-state platform also impacts simulation performance, where the run time may be slower and may consume more memory. The present disclosure supports a simulation compiler that is 4-state but can support emulation-like 2-state modeling for x and z in certain cases, in order to achieve behavioral equivalency with higher performance.

In a 4-state simulation, a net can receive a value of "z" from a driver driving a constant "z". In some embodiments, the net can receive a value of "z" from an output of a tristate construct producing "z". In some embodiments, the net can receive a value from "z" implicitly if the net is undriven. Referring to FIG. 2, the processing logic assigns a wire "a" with a "z" state value, e.g., using direct assignment. The processing logic further assigns a wire "b" with a "z" state value, e.g., using an indirect assignment (i.e., by assigning wire "b" to wire "a" which was directly assigned to "z" as illustrated in FIG. 2). If the value of "en" is determined to be 1, the processing logic assigns a wire "c" with a "z" state value. In order to correct functional behavior to achieve behavioral equivalency as described herein above, the processing logic can propagate the "z" value to downstream logic on a case-by-case basis. For example, as illustrated in FIG. 2, wire "e" is multi-driven by wire "b" and wire "d". For a correct multi-driver resolution, the processing logic propagates the "z" value through wire "a" and wire "b". In the aforementioned example, if "a" or "b" were converted to a 2-state value, multi-driver resolution can produce a wrong value for wire "e". In some embodiments, for cases other than multi-driver, the processing logic replaces (e.g., assigns, substitutes, etc.) the "z" value with a constant 2-state value. The last statement illustrated in FIG. 2 refers to an AND gate modeled using "b" and "d" as inputs and "o2" as the output. In this statement, the processing logic can replace (e.g., assign, substitute, etc.) the "1'bz" value of "b" with a 2-state constant value. The 2-state constant value can be determined based on a user choice of pull-up, pull-down, keeper, etc. In the aforementioned statement, performing the described transformation to replace the value of "b" with a 2-state constant value enables the simulation behavior to be functionally equivalent to emulation behavior. Without the transformation, the AND gate may produce an "X" value, which is different from emulation behavior.

In some embodiments, the processing logic can implement one or more transformations for a "reg" datatype to ensure consistent functional behavior between simulation and emulation, as described herein. A datatype defines a type of value that a signal can hold. A "reg" datatype refers to a register datatype. A "reg" datatype declaration in simulation determines the registers. In simulation, registers are initialized either to an "X" value or to a specific value in the RTL. In a hardware-based emulation flow, a "reg" datatype is an output of a library cell in either of two logic states, 0 or 1. In some embodiments, the processing logic can perform one or more transformations for the "reg" datatype. In some embodiments, the processing logic determines whether the "reg" datatype is initialized (e.g., assigned an initial value) or uninitialized (e.g., not assigned an initial value). The processing logic can determine whether the "reg" datatype is initialized or uninitialized based on the one or more inputs at 505. In response to determining that the "reg" is uninitialized, the processing logic can initialize the "reg". In some embodiments, the processing logic can determine an asynchronous set/reset based on the coding style of the "reg" datatype, which can be used to determine a correct initialization of the "reg" datatype. In some embodiments, the processing logic can determine is the "reg" datatype (e.g., as used in combinatorial logic) is undriven. If the "reg" datatype is undriven, the processing logic can initialize the "reg" to an "X" value, whereas in emulation, undriven "reg" datatypes are initialized with a "z" value. In some embodiments, the processing logic can determine the drive value by a user-specified option for an undriven net (e.g., from the one or more inputs at 505), such as a 0 or 1 depending on the user's preferences.

For example, referring to FIG. 3A, in some embodiments, the processing logic can determine that a "reg" is initialized (e.g., "explicitly_initialized_reg" as illustrated in FIG. 3A). If the processing logic determines that the "reg" is initialized, the processing logic does not transform the reg, e.g., the processing logic ignores the "reg" datatype. In response to determining that the "reg" datatype is uninitialized (e.g., "un_initialized_reg" as illustrated in FIG. 3A), the processing logic can assign an initial value (e.g., 0) to the "reg" datatype. In some embodiments, the processing logic can initialize an "undriven_reg" datatype (e.g., a register that is not driven anywhere in the RTL) to an initial value, such as "1'bz". In some embodiments, the processing logic can identify a "flop_initialized_reg" (e.g., a register where a flop behavior is defined through an always block). The processing logic determines whether a reset "rst" is active. If the reset "rst" is active, the processing logic assigns "flop_initialized_reg" to an initial value (e.g., 1'b1). If the reset "rst" is not active, the processing logic flops the data on the positive edge of the clock. In some embodiments, other types of transformations can be performed in order to convert the 4-state infrastructure of an emulation system to a 2-state infrastructure of a simulation system.

Referring to FIG. 3B, the processing logic can identify an undriven reg (e.g., "undriven_reg_ as illustrated in FIG. 3B). In response to identifying the undriven reg, the processing logic can initialize the undriven reg to either 0 or 1 logic states. In some embodiments, the processing logic can initialize the undriven reg based on a user-specified value (e.g., from the one or more inputs at 505). In some embodiments, the processing logic can handle the "z" state for functional equivalence by substituting "b1" with a 2-state value (e.g., pull-up, pull-down, etc.) and evaluating the AND gate illustrated in FIG. 3B. In some embodiments, the processing logic can handle the "z" state for multidriver cases. For example, in FIG. 3B, "a" is multidriven. The processing logic can assign a1 to equal b1 in order to handle the "z" state. In some embodiments, the processing logic can handle the "x" state in cases where "reg" is initialized. For example, in FIG. 3B, the processing logic can initialize "un_initialized_reg" to 0 or a user-specific value (e.g., from the one or more inputs at 505).

At 525, the processing logic can perform a design verification using the modified simulation compiler. In some embodiments, performing the design verification can include using the one or more inputs in the simulation compiler as modified at 520.

Figure 6:
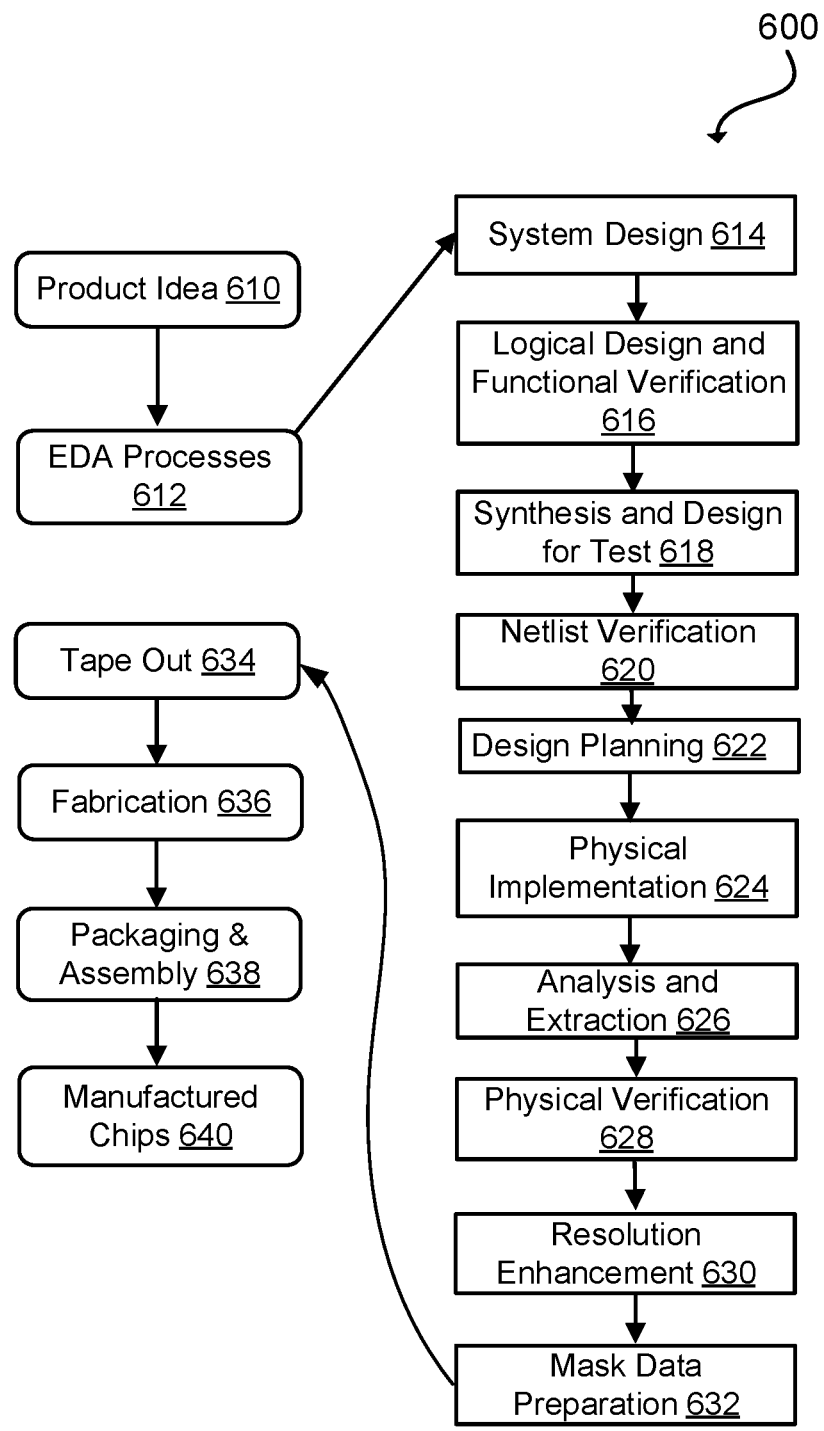
FIG. 6 depicts a flowchart of various processes used during the design and manufacture of an integrated circuit, in accordance with some embodiments of the present disclosure.

FIG. 6 illustrates an example set of processes 600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 610 with information supplied by a designer, information which is transformed to create an article of manufacture that uses a set of EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed to produce the finished integrated circuit 640.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 6. The processes described by be enabled by EDA products (or tools).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification. In some embodiments of the present disclosure, the present system described with respect to FIG. 1 is a part of the logic design and functional verification 616 stage.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 800 of FIG. 8, or a host system) may be used to store the programs and data structures that are used by some or all of the EDA products described herein, and products used for development of cells for the library and for physical and logical design that use the library.

Figure 7:
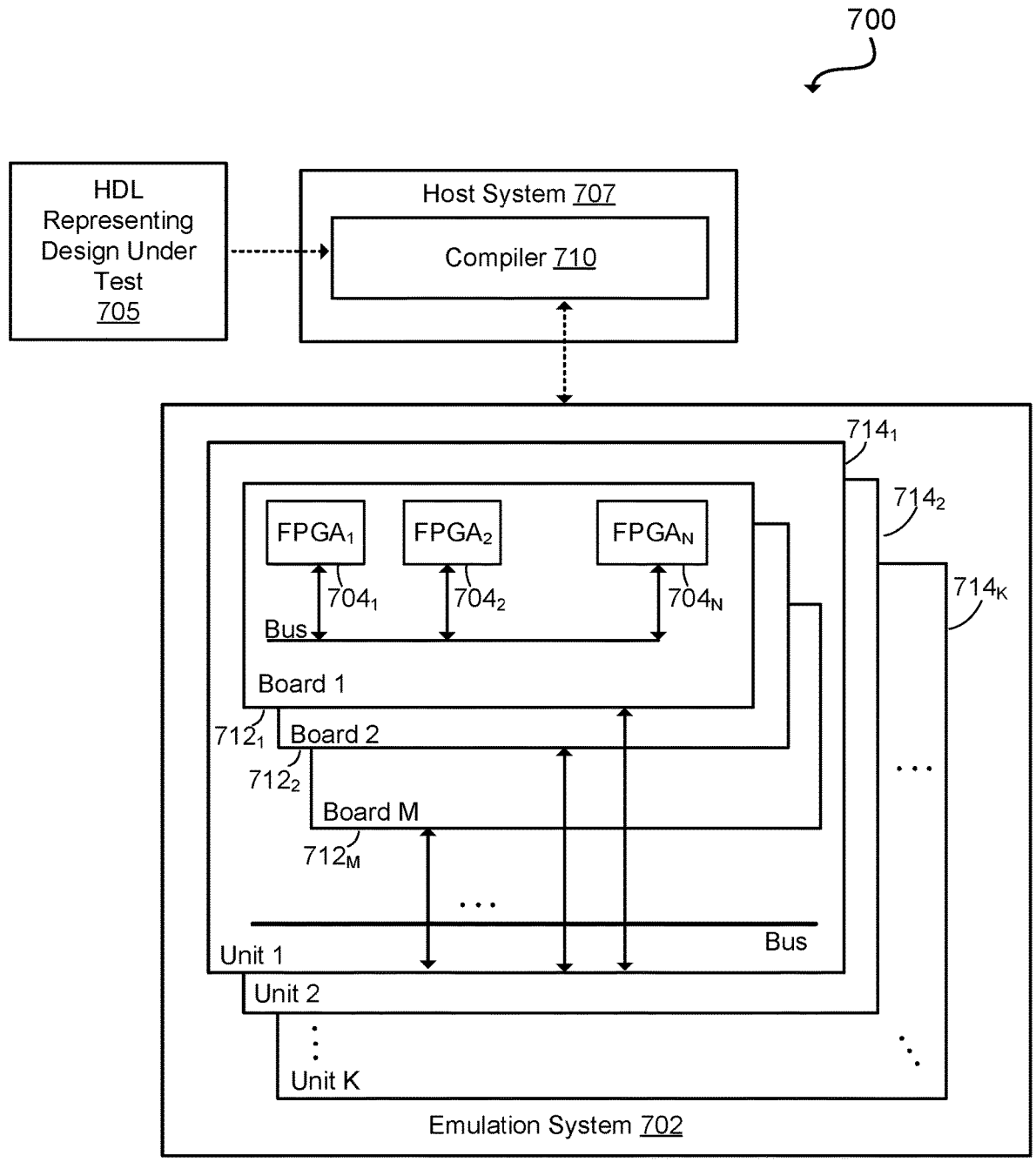
FIG. 7 depicts a diagram of an example emulation system, in accordance with some embodiments of the present disclosure.

FIG. 7 depicts a diagram of an example emulation environment 700. An emulation environment 700 may be configured to verify the functionality of the circuit design. The emulation environment 700 may include a host system 707 (e.g., a computer that is part of an EDA system) and an emulation system 702 (e.g., a set of programmable devices such as Field Programmable Gate Arrays (FPGAs) or processors). The host system generates data and information by using a compiler 710 to structure the emulation system to emulate a circuit design. A circuit design to be emulated is also referred to as a Design Under Test ('DUT') where data and information from the emulation are used to verify the functionality of the DUT.

The host system 707 may include one or more processors. In the embodiment where the host system includes multiple processors, the functions described herein as being performed by the host system can be distributed among the multiple processors. The host system 707 may include a compiler 710 to transform specifications written in a description language that represents a DUT and to produce data (e.g., binary data) and information that is used to structure the emulation system 702 to emulate the DUT. The compiler 710 can transform, change, restructure, add new functions to, and/or control the timing of the DUT.

The host system 707 and emulation system 702 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 707 and emulation system 702 can exchange data and information through a third device such as a network server.

The emulation system 702 includes multiple FPGAs (or other modules) such as FPGAs $704_1$ and $704_2$ as well as additional FPGAs to $704_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 702 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $704_1$-$704_N$ may be placed onto one or more boards $712_1$ and $712_2$ as well as additional boards through $712_M$. Multiple boards can be placed into an emulation unit $714_1$. The boards within an emulation unit can be connected using the backplane of the emulation unit or any other types of connections. In addition, multiple emulation units (e.g., $714_1$ and $714_2$ through $714_K$) can be connected to each other by cables or any other means to form a multi-emulation unit system.

For a DUT that is to be emulated, the host system 707 transmits one or more bit files to the emulation system 702. The bit files may specify a description of the DUT and may further specify partitions of the DUT created by the host system 707 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 707 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 707 and/or the compiler 710 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 705 into gate level logic. For a DUT that is to be emulated, the design synthesizer sub-system receives a description of the DUT. If the description of the DUT is fully or partially in HDL (e.g., RTL or other level of representation), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   receiving, by a processing device, one or more inputs for design verification of an integrated circuit using an emulation compiler;
   determining, by the processing device, a type of compiler for processing the one or more inputs;
   in response to determining that the type of compiler is a simulation compiler, modifying the simulation compiler according to the one or more inputs to form a modified simulation compiler to match one or more emulation semantics associated with the emulation compiler, wherein modifying the simulation compiler comprises:
      performing, using the one or more inputs, one or more transformations to convert a 4-state logic state to a 2-state logic state to match one or more emulation semantics associated with the emulation compiler, wherein a transformation of the one or more transformations comprises:
         parsing a register-transfer level (RTL) statement from the one or more inputs;
         in response to parsing the RTL statement, identifying an uninitialized register in the RTL statement;
         identifying an initial value from the one or more inputs, wherein the initial value is specified by a user; and assigning the uninitialized register to the initial value; and performing a design verification using the modified simulation compiler.

2. The method of claim 1, wherein modifying the simulation compiler according to the one or more inputs further comprises:

identifying a register-transfer level (RTL) statement from the one or more inputs; parsing the RTL statement for one or more clock generation events and one or more non-clock generation events;

processing the one or more clock generation events; and ignoring the one or more non-clock generation events.

3. The method of claim 1, wherein modifying the simulation compiler according to the one or more inputs further comprises:

determining that a debug feature is enabled based on the one or more inputs; and in response to determining that the debug feature is not enabled based on the one or more inputs, disabling the debug feature in the simulation compiler.

4. The method of claim 1, wherein modifying the simulation compiler according to the one or more inputs further comprises:

identifying a preloaded memory file;

performing a permanent programming operation to store one or more values of the preloaded memory file into a multi-dimensional array-based software model associated with the simulation compiler;

performing constant propagation using the one or more values stored in the multi dimensional array-based software model;

identifying a write-only memory from the one or more inputs; and ignoring the write-only memory.

5. The method of claim 1, wherein modifying the simulation compiler according to the one or more inputs further comprises:

identifying, from the one or more inputs, one or more RTL blocks using a clock source; and ignoring the one or more RTL blocks using the clock source.

6. A system comprising:

a memory storing instructions; and a processor, coupled with the memory and to execute the instructions, the instructions when executed cause the processor to:

receive, by a processing device, one or more inputs for design verification of an integrated circuit using an emulation compiler;

determine, by the processing device, a type of compiler for processing the one or more inputs;

in response to determining that the type of compiler is a simulation compiler, modifying the simulation compiler according to the one or more inputs to form a modified simulation compiler to match one or more emulation semantics associated with the emulation compiler, wherein modifying the simulation compiler comprises:

performing, using the one or more inputs, one or more transformations to convert a 4-state logic state to a 2-state logic state to match one or more emulation semantics associated with the emulation compiler, wherein a transformation of the one or more transformations comprises:

parsing a register-transfer level (RTL) statement from the one or more inputs;

in response to parsing the RTL statement, identifying an undriven register in the RTL statement;

identifying an initial value from the one or more inputs, wherein the initial value is specified by a user; and assigning the undriven register to the initial value; and performing a design verification using the modified simulation compiler.

7. The system of claim 6, wherein modifying the simulation compiler according to the one or more inputs further comprises:

identifying a register-transfer level (RTL) statement from the one or more inputs; parsing the RTL statement for one or more clock generation events and one or more non-clock generation events;

processing the one or more clock generation events; and ignoring the one or more non-clock generation events.

8. The system of claim 6, wherein modifying the simulation compiler according to the one or more inputs further comprises:

determining that a debug feature is enabled based on the one or more inputs; and in response to determining that the debug feature is not enabled based on the one or more inputs, disabling the debug feature in the simulation compiler.

9. A non-transitory computer readable storage medium storing instructions, which when executed by a processor, cause the processor to:

receive one or more inputs for design verification of an integrated circuit using an emulation compiler;

determine, by a processor, a type of compiler for processing the one or more inputs; and in response to determining that the type of compiler is a simulation compiler, modify the simulation compiler according to the one or more inputs to convert a 4-state logic state into a 2-state logic state to match one or more emulation semantics associated with the emulation compiler, wherein modifying the simulation compiler according to the one or more inputs to convert the 4-state logic state into the 2-state logic state further comprises:

parsing a register-transfer level (RTL) statement from the one or more inputs; and in response to parsing the RTL statement, identifying a value of a z logic state in the RTL statement.

10. The non-transitory computer readable storage medium of claim 9, wherein modifying the simulation compiler according to the one or more inputs to convert the 4-state logic state into the 2-state logic state further comprises:

replacing the value of the z logic state with a constant 2-state value; and evaluating an AND logic gate using at least the constant 2-state value.

11. The non-transitory computer readable storage medium of claim 9, wherein modifying the simulation compiler according to the one or more inputs to convert the 4-state logic state into the 2-state logic state further comprises:

determining that the integrated circuit is a multidriver circuit; and assigning the value of the z logic state to one or more values of wires of the integrated circuit.

* * * * *